United States Patent
Shao et al.

(10) Patent No.: US 10,319,324 B2
(45) Date of Patent: Jun. 11, 2019

(54) SHIFT REGISTERS, DRIVING METHODS, GATE DRIVING CIRCUITS AND DISPLAY APPARATUSES WITH REDUCED SHIFT REGISTER OUTPUT SIGNAL VOLTAGE SWITCHING TIME

(71) Applicants: BOE TECHNOLOGY GROUP CO., LTD., Beijing (CN); HEFEI BOE OPTOELECTRONICS TECHNOLOGY CO., LTD., Hefei, Anhui (CN)

(72) Inventors: Xianjie Shao, Beijing (CN); Junsheng Chen, Beijing (CN)

(73) Assignees: BOE TECHNOLOGY GROUP CO., LTD., Beijing (CN); HEFEI BOE OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 0 days.

(21) Appl. No.: 15/680,452

(22) Filed: Aug. 18, 2017

(65) Prior Publication Data

US 2018/0197497 A1 Jul. 12, 2018

(30) Foreign Application Priority Data

Jan. 6, 2017 (CN) .......................... 2017 1 0009409

(51) Int. Cl.
G09G 3/36 (2006.01)
G11C 19/28 (2006.01)

(52) U.S. Cl.
CPC .......... *G09G 3/3677* (2013.01); *G11C 19/28* (2013.01); *G11C 19/287* (2013.01);
(Continued)

(58) Field of Classification Search
CPC .......... G09G 2310/0286; G09G 3/3674–3681
See application file for complete search history.

(56) References Cited

U.S. PATENT DOCUMENTS 9,715,860 B2 7/2017 Yang et al.
9,824,656 B2 11/2017 Chen et al.
(Continued)

FOREIGN PATENT DOCUMENTS

CN 103426414 A 12/2013
CN 104867439 A 8/2015
(Continued)

OTHER PUBLICATIONS

First Chinese Office Action dated Jul. 27, 2017, received for corresponding Chinese Application No. 201710009409.3.

*Primary Examiner* — Sanghyuk Park
(74) *Attorney, Agent, or Firm* — Kinney & Lange, P.A.

(57) ABSTRACT

The embodiments of the present application provide a shift register and a method for driving the same. The shift register comprises: an input unit, a pull-up unit, a reset unit, a pull-down control unit, a pull-down unit and a pull-up holding unit. The input unit is configured to couple a first voltage terminal to a pull-up point. The pull-up unit is configured to couple a clock signal terminal to an output signal terminal. The reset unit is configured to couple a second voltage terminal to the pull-up point. The pull-down control unit is configured to selectively couple one of the second voltage terminal and a third voltage terminal to a pull-down point. The pull-down unit is configured to couple the second voltage terminal to the pull-up point and the output signal terminal. The pull-up holding unit is configured to couple a fourth voltage terminal to the pull-up point.

12 Claims, 6 Drawing Sheets

(52) U.S. Cl.
CPC ... *G09G 3/3648* (2013.01); *G09G 2300/0408* (2013.01); *G09G 2310/0286* (2013.01); *G09G 2310/08* (2013.01)

(56) References Cited

U.S. PATENT DOCUMENTS

| | | | |
|---|---|---|---|
| 2006/0269038 A1* | 11/2006 | Jang | G11C 19/287 377/64 |
| 2008/0048712 A1 | 2/2008 | Ahn et al. | |
| 2010/0158188 A1 | 6/2010 | Lee et al. | |
| 2013/0249872 A1* | 9/2013 | Kang | G09G 3/3677 345/204 |
| 2015/0318053 A1* | 11/2015 | Zhang | G09G 3/36 377/64 |
| 2016/0335962 A1* | 11/2016 | Xiao | G09G 3/36 |
| 2017/0178558 A1 | 6/2017 | Zhou et al. | |
| 2017/0364170 A1 | 12/2017 | Gu et al. | |

FOREIGN PATENT DOCUMENTS

| | | |
|---|---|---|
| CN | 105096879 A | 11/2015 |
| CN | 105489189 A | 4/2016 |
| CN | 105609138 A | 5/2016 |
| KR | 20140136254 A | 11/2014 |

\* cited by examiner

SHIFT REGISTERS, DRIVING METHODS, GATE DRIVING CIRCUITS AND DISPLAY APPARATUSES WITH REDUCED SHIFT REGISTER OUTPUT SIGNAL VOLTAGE SWITCHING TIME

CROSS-REFERENCE TO RELATED APPLICATION(S)

This application claims priority to the Chinese Patent Application No. 201710009409.3, filed on Jan. 6, 2017, entitled "SHIFT REGISTERS AND METHODS FOR DRIVING THE SAME, GATE DRIVING CIRCUITS AND DISPLAY APPARATUSES," which is incorporated herein by reference in its entirety.

TECHNICAL FIELD

The present application relates to the field of display technology, and more particularly, to a shift register and a method for driving the same, a gate driving circuit and a display apparatus.

BACKGROUND

A liquid crystal display panel comprises a pixel matrix which is driven in a progressive scan manner for display. A driver of a common Thin Film Transistor-Liquid Crystal Display (TFT-LCD) comprises a gate driver and a data driver. The gate driver comprises shift registers, which comprise a plurality of cascaded shift registers. Output signal terminals of the shift registers are correspondingly connected to gate lines of the pixel matrix, and each gate line is connected to one row of pixels of the pixel matrix. The shift registers sequentially output gate scanning signals in a form of pulse for various gate lines under the control of a clock signal, to realize progressive scanning of the pixel matrix.

In the display panel, the gate driving circuit may be in an encapsulation form of Chip On Film (COF) or Chip On Glass (COG), or may be in a form of Gate On Array (GOA). For the liquid crystal display panel, the GOA form for the gate driver can reduce the product cost and the production processes and improve the production capacity.

SUMMARY

The embodiments of the present application provide a shift register and a method for driving the same, a gate driving circuit and a display apparatus.

According to a first aspect, the embodiments of the present application provide a shift register, comprising: an input unit coupled to an input signal terminal, a first voltage terminal and a pull-up point, and configured to couple the first voltage terminal to the pull-up point under the control of an input signal from the input signal terminal; a pull-up unit coupled to the pull-up point, a clock signal terminal and an output signal terminal, and configured to couple the clock signal terminal to the output signal terminal under the control of a voltage at the pull-up point; a reset unit coupled to a reset signal terminal, a second voltage terminal and the pull-up point, and configured to couple the second voltage terminal to the pull-up point under the control of a reset signal from the reset signal terminal; a pull-down control unit coupled to the pull-up point, the second voltage terminal, a third voltage terminal and the pull-down point, and configured to selectively couple one of the second voltage terminal and the third voltage terminal to the pull-down point under the control of the voltage at the pull-up point; a pull-down unit coupled to the pull-down point, the second voltage terminal, the pull-up point and the output signal terminal, and configured to couple the second voltage terminal to the pull-up point and the output signal terminal under the control of a voltage at the pull-down point; and a pull-up holding unit coupled to the pull-up holding signal terminal, a fourth voltage terminal and the pull-up point, and configured to couple the fourth voltage terminal to the pull-up point under the control of a pull-up holding signal from the pull-up holding signal terminal.

In the embodiments of the present application, the pull-up holding unit is coupled to the pull-up holding signal terminal and the pull-up point, and is configured to couple the pull-up holding signal terminal to the pull-up point under the control of the pull-up holding signal from the pull-up holding signal terminal.

In the embodiments of the present application, the pull-up holding unit comprises a first transistor having a control electrode coupled to the pull-up holding signal terminal, a first electrode coupled to the fourth voltage terminal and a second electrode coupled to the pull-up point.

In the embodiments of the present application, the input unit comprises a second transistor having a control electrode coupled to the input signal terminal, a first electrode coupled to the first voltage terminal and a second electrode coupled to the pull-up point.

In the embodiments of the present application, the pull-up unit comprises a third transistor and a first capacitor. The third transistor has a control electrode coupled to the pull-up point, a first electrode coupled to the clock signal terminal and a second electrode coupled to the output signal terminal. The first capacitor has two terminals coupled between the control electrode and the second electrode of the third transistor.

In the embodiments of the present application, the reset unit comprises a fourth transistor having a control electrode coupled to the reset signal terminal, a first electrode coupled to the second voltage terminal and a second electrode coupled to the pull-up point.

In the embodiments of the present application, the pull-down control unit comprises a fifth transistor, a sixth transistor, a seventh transistor and an eighth transistor. The fifth transistor has a control electrode and a first electrode coupled to the third voltage terminal and a second electrode coupled to a control terminal of the sixth transistor. The sixth transistor has a first electrode coupled to the third voltage terminal and a second electrode coupled to the pull-down point. The seventh transistor has a control electrode coupled to the pull-up point, a first electrode coupled to the second voltage terminal and a second electrode coupled to the control electrode of the sixth transistor. The eighth transistor has a control electrode coupled to the pull-up point, a first electrode coupled to the second voltage terminal and a second electrode coupled to the pull-down point.

In the embodiments of the present application, the pull-down unit comprises a ninth transistor and a tenth transistor. The ninth transistor has a control electrode coupled to the pull-down point, a first electrode coupled to the second voltage terminal and a second electrode coupled to the pull-up point. The tenth transistor has a control electrode coupled to the pull-down point, a first electrode coupled to the second voltage terminal and a second electrode coupled to the output signal terminal.

According to a second aspect, the embodiments of the present application provide a method for driving a shift register, comprising: applying a valid signal to an input signal terminal, and applying an invalid signal to a clock signal terminal and a reset signal terminal, so that a voltage at a pull-up point is valid to control the pull-up unit to couple the clock signal terminal to an output signal terminal and the output signal terminal to output an invalid signal; applying a valid signal to the clock signal terminal, and applying an invalid signal to the input signal terminal and the reset signal terminal, so that the voltage at the pull-up point is valid to control the pull-up unit to couple the clock signal terminal to the output signal terminal and the output signal terminal to output a valid signal; applying an invalid signal to the input signal terminal, the clock signal terminal and the reset signal terminal, and maintaining the voltage at the pull-up point to be valid, to control the pull-up unit to couple the clock signal terminal to the output signal terminal and the output signal terminal to output an invalid signal; applying a valid signal to the reset signal terminal and applying an invalid signal to the input signal terminal, so that the voltage at the pull-up point is invalid to control a pull-down unit to couple the second voltage terminal to the pull-up point and the output signal terminal, and the output signal terminal to output an invalid signal; and applying an invalid signal to the input signal terminal and the reset signal terminal, so that the voltage at the pull-up point is invalid to control the pull-down unit to couple the second voltage terminal to the pull-up point and the output signal terminal, and the output signal to output an invalid signal.

In the embodiments of the present application, maintaining the voltage at the pull-up point to be valid comprises: applying a valid signal to a pull-up holding signal terminal to control a pull-up holding unit to couple a fourth voltage terminal to the pull-up point.

According to a third aspect, the embodiments of the present application provide a gate driving circuit comprising a plurality of cascaded shift registers described above. In every three stages of shift registers, a first stage of shift register has an output signal terminal coupled to an input signal terminal of a second stage of shift register, a pull-up holding signal terminal coupled to an output signal terminal of the second stage of shift register and a reset signal terminal coupled to an output signal terminal of a third stage of shift register; a clock signal terminal of the first stage of shift register and a clock signal terminal of the third stage of shift register are coupled to a first clock signal source; and a clock signal terminal of the second stage of shift register is coupled to a second clock signal source.

According to a fourth aspect, the embodiments of the present application provide a display apparatus comprising the gate driving circuit described above.

BRIEF DESCRIPTION OF THE DRAWINGS

In order to more clearly illustrate the technical solutions according to the embodiments of the present application, the accompanying drawings of the embodiments will be briefly described below, and it should be understood that the accompanying drawings described below only relate to some embodiments of the present application and are not intended to limit the present application, wherein in accompanying drawings.

DETAILED DESCRIPTION

In order to make the technical solutions and advantages of the embodiments of the present application more obvious, the technical solutions according to the embodiments of the present application will be described clearly and completely below with reference to the accompanying drawings. It is obvious that the described embodiments are a part of the embodiments of the present application instead of all the embodiments. All other embodiments obtained by those skilled in the art based on the described embodiments of the present application without contributing any creative work are also within the protection scope of the present application.

Currently, in a shift register of a gate driving circuit in a form of GOA, in order to output a pulse signal, an output signal terminal is first connected to a clock signal terminal by a pull-up unit. In this case, a clock signal is at a valid voltage, and the output signal terminal outputs a valid voltage part of a pulse signal. Then, the output signal terminal is connected to a voltage terminal which supplies an invalid voltage by a pull-down unit to output an invalid voltage part of the pulse signal. As it takes some time for a transistor in the pull-down unit to be switched from turn-off to turn-on, it takes a long time for the pulse signal to be switched from a valid voltage to an invalid voltage and the pulse signal does not have a steep enough edge, which may cause noise and may result in problems such as malfunction of the circuit.

The shift register and the method for driving the same, the gate driving circuit and the display apparatus according to the embodiments of the present application can reduce the switching time for the voltage of the output signal of the shift register.

Figure 1:
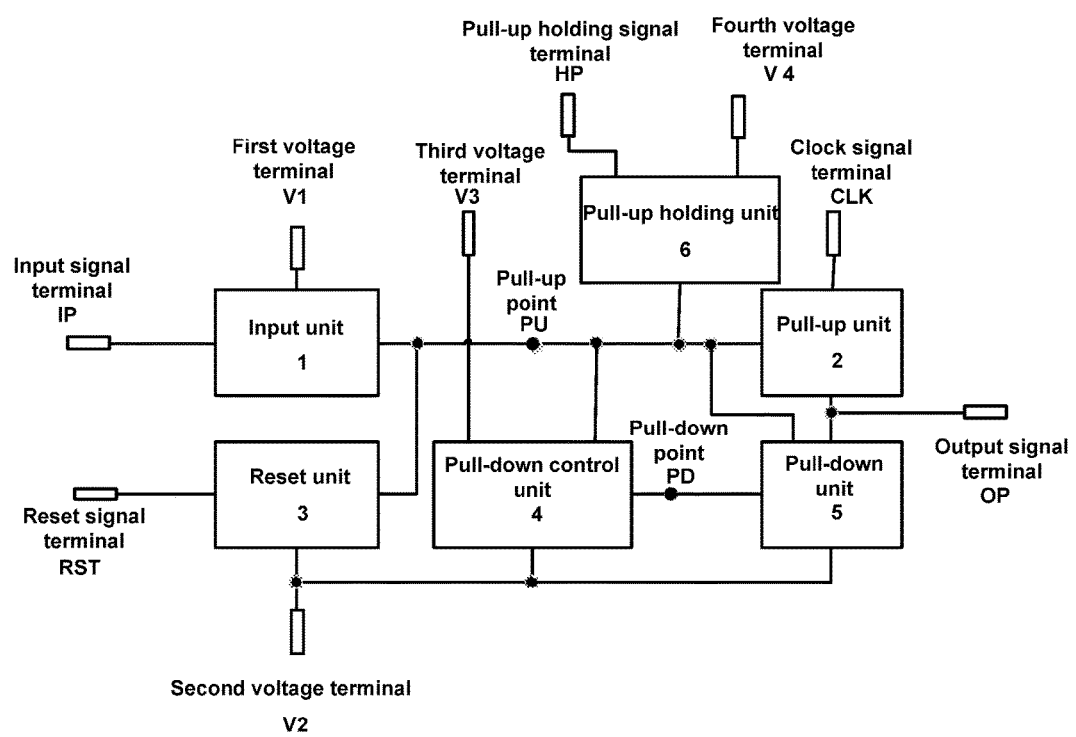
FIG. 1 is a first block diagram of a shift register according to an embodiment of the present application.

FIG. 1 is a first block diagram of a shift register according to an embodiment of the present application. As shown in FIG. 1, the embodiment of the present application provides a shift register, which includes an input unit 1, a pull-up unit 2, a reset unit 3, a pull-down control unit 4, a pull-down unit 5 and a pull-up holding unit 6. The input unit 1 is coupled to an input signal terminal IP, a first voltage terminal V1 and a pull-up point PU, and is configured to couple the first voltage terminal V1 to the pull-up point PU under the control of an input signal from the input signal terminal IP. The pull-up unit 2 is coupled to the pull-up point PU, a clock signal terminal CLK and an output signal terminal OP, and is configured to couple the clock signal terminal CLK to the output signal terminal OP under the control of a voltage at the pull-up point PU. The reset unit 3 is coupled to a reset signal terminal RST, a second voltage terminal and the pull-up point PU, and is configured to couple the second voltage terminal V2 to the pull-up point PU under the control of a reset signal from the reset signal terminal RST.

The pull-down control unit 4 is coupled to the pull-up point PU, the second voltage terminal V2, a third voltage terminal V3 and the pull-down point PD, and is configured to selectively couple one of the second voltage terminal V2 and the third voltage terminal V3 to the pull-down point PD under the control of the voltage at the pull-up point PU. The pull-down unit 5 is coupled to the pull-down point PD, the second voltage terminal V2, the pull-up point PU and the output signal terminal OP, and is configured to couple the second voltage terminal V2 to the pull-up point PU and the output signal terminal OP under the control of a voltage at the pull-down point PD. The pull-up holding unit 6 is coupled to the pull-up holding signal terminal HP, a fourth voltage terminal V4 and the pull-up point PU, and is configured to couple the fourth voltage terminal V4 to the pull-up point PU under the control of a pull-up holding signal from the pull-up holding signal terminal HP. It is generally understood by those skilled in the art that coupling refers to direct or indirect electrical connections.

The pull-up holding unit 6 is configured to hold the voltage at the pull-up point PU to maintain coupling between the clock signal terminal CLK and the output signal terminal OP. When the voltage of the clock signal at the clock signal terminal CLK is switched (for example, from a high voltage to a low voltage), the voltage of the output signal at the output signal terminal OP is switched therewith. In this process, rapid switching can be realized without using other units than the pull-up unit 2.

Figure 2:
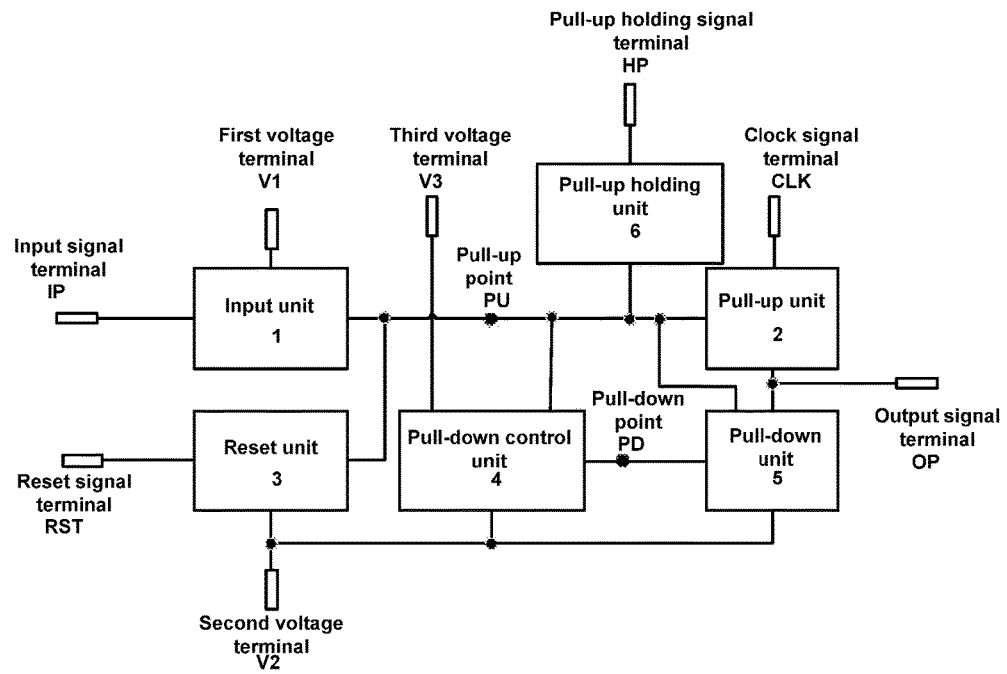
FIG. 2 is a second block diagram of a shift register according to an embodiment of the present application.

FIG. 2 is a second block diagram of a shift register according to an embodiment of the present application. The fourth voltage terminal V4 may be omitted when the valid voltage of the pull-up holding signal is the same as the voltage supplied by the fourth voltage terminal V4. Thereby, the pull-up holding unit 6 is coupled to the pull-up holding signal terminal HP and the pull-up point PU and is configured to couple the pull-up holding signal terminal HP to the pull-up point PU under the control of the pull-up holding signal from the pull-up holding signal terminal HP. This can save space for the circuit.

It is generally understood by those skilled in the art that the valid voltage refers to a voltage which enables a unit to operate. For example, the valid voltage at the pull-up holding signal terminal HP may cause the pull-up holding unit 6 to operate to couple the pull-up holding signal terminal HP to the pull-up point PU. Accordingly, the invalid voltage may cause the pull-up holding unit 6 not to operate to turn off a connection between the pull-up holding signal terminal HP and the pull-up point PU.

Figure 3:
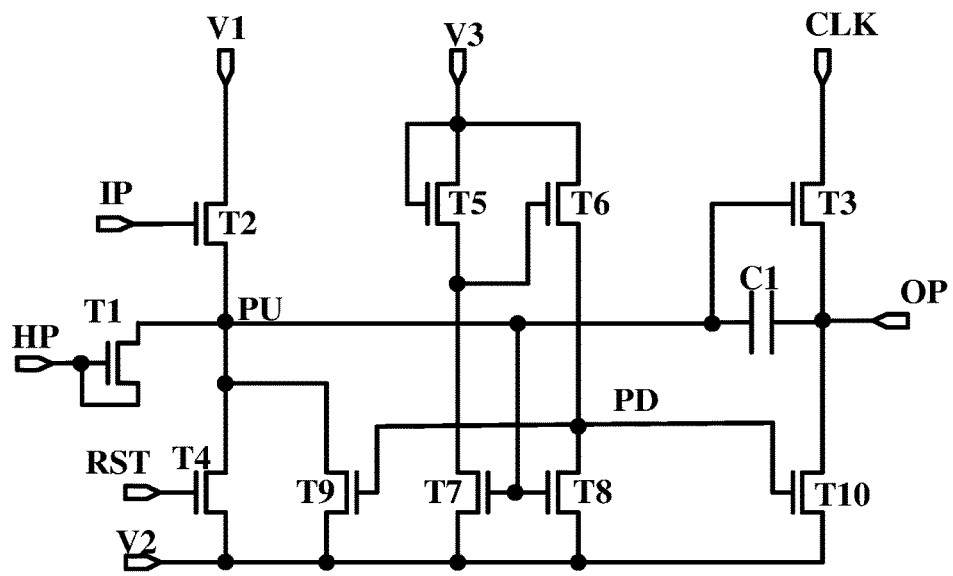
FIG. 3 is a circuit diagram of the shift register shown in FIG. 2.

FIG. 3 is a circuit diagram of the shift register shown in FIG. 2. As shown in FIG. 3, the pull-up holding unit 6 comprises a first transistor T1 having a control electrode and a first electrode coupled to the pull-up holding signal terminal HP and a second electrode coupled to the pull-up point PU.

The pull-up holding unit 6 is implemented using a transistor, which is beneficial to production of an integrated circuit. It is to be understood that it is not intended to be limiting of the present application and the pull-up holding unit 6 may be implemented using any element or circuit having a switching function.

Hereinafter, as an example, implementations of other units will also be described.

The input unit 1 includes a second transistor T2 having a control electrode coupled to the input signal terminal IP, a first electrode coupled to the first voltage terminal V1 and a second electrode coupled to the pull-up point PU.

The pull-up unit 2 includes a third transistor T3 and a first capacitor C1. The third transistor T3 has a control electrode coupled to the pull-up point PU, a first electrode coupled to the clock signal terminal CLK and a second electrode coupled to the output signal terminal OP, and the first capacitor C1 has two terminals coupled between the control electrode and the second electrode of the third transistor T3.

The reset unit 3 includes a fourth transistor T4 having a control electrode coupled to the reset signal terminal RST, a first electrode coupled to the second voltage terminal V2 and a second electrode coupled to the pull-up point PU.

The pull-down control unit 4 includes a fifth transistor T5, a sixth transistor T6, a seventh transistor T7 and an eighth transistor T8. The fifth transistor T5 has a control electrode and a first electrode coupled to the third voltage terminal V3 and a second electrode coupled to a control terminal of the sixth transistor T6. The sixth transistor T6 has a first electrode coupled to the third voltage terminal V3 and a second electrode coupled to the pull-down point PD. The seventh transistor T7 has a control electrode coupled to the pull-up point PU, a first electrode coupled to the second voltage terminal V2 and a second electrode coupled to the control electrode of the sixth transistor T6. The eighth transistor T8 has a control electrode coupled to the pull-up point PU, a first electrode coupled to the second voltage terminal V2 and a second electrode coupled to the pull-down point PD.

The pull-down unit 5 includes a ninth transistor T9 and a tenth transistor T10. The ninth transistor T9 has a control electrode coupled to the pull-down point PD, a first electrode coupled to the second voltage terminal V2 and a second electrode coupled to the pull-up point PU. The tenth transistor T10 has a control electrode coupled to the pull-down point PD, a first electrode coupled to the second voltage terminal V2 and a second electrode coupled to the output signal terminal OP.

Figure 4:
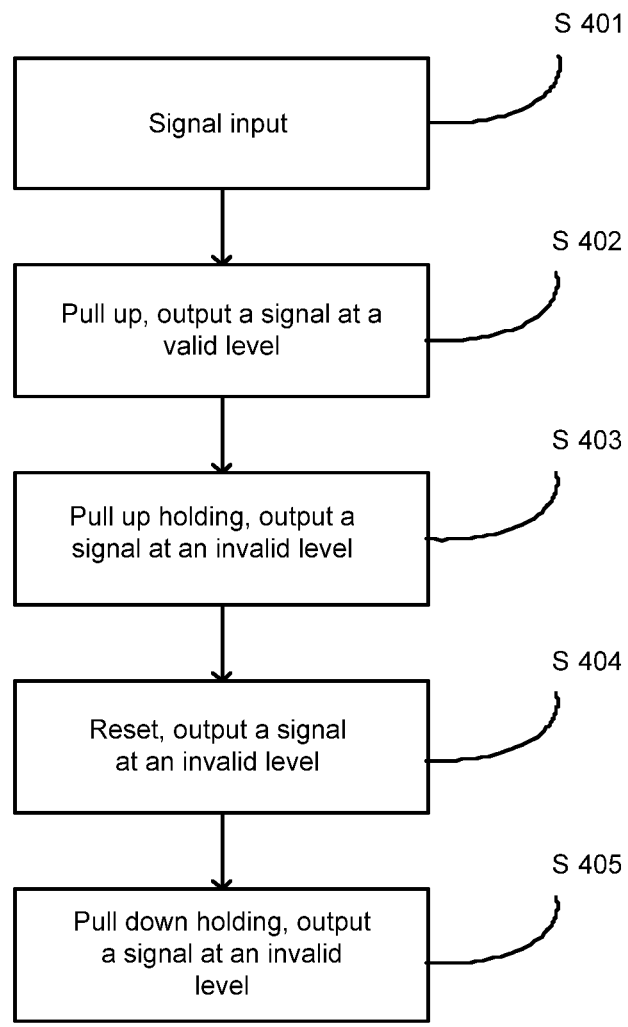
FIG. 4 is a flowchart of a method for driving a shift register according to an embodiment of the present application.
Figure 5:
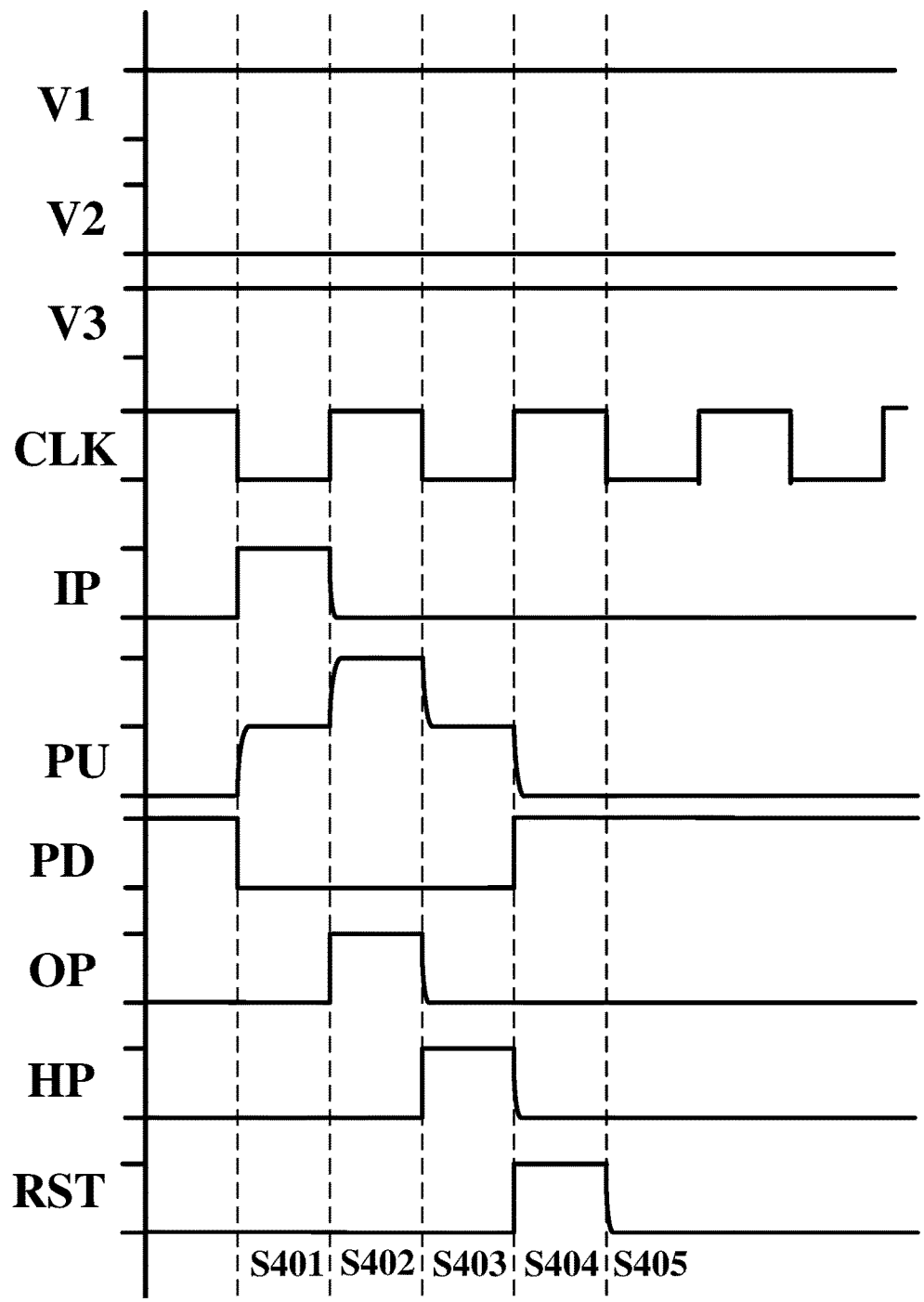
FIG. 5 is a first operation timing diagram corresponding to the driving method shown in FIG. 4.

FIG. 4 is a flowchart of a method for driving a shift register according to an embodiment of the present application. FIG. 5 is a first operation timing diagram corresponding to the driving method shown in FIG. 4. Hereinafter, the method and operation timing for driving a shift register will be described with reference to FIGS. 3, 4, and 5 by taking all the transistors in FIG. 3 being N-type transistors as an example.

It is generally understood by those skilled in the art that the valid signal refers to a signal which enables a unit to operate, and may be a valid voltage, valid current, or other forms of signal. Here, the valid signal is used to control a switch transistor, and refers to a valid voltage. For N-type transistors, the valid voltage refers to a high voltage. It should be understood that the "high voltage" here is only used to represent a function of the voltage and does not limit amplitude thereof. For example, the "high voltage" may be 3.3V, 5V, etc., and the "low voltage" may be 0V, −3.3V, −5V, etc.

As shown in FIG. 4, the driving method starts at step S401, which is a signal input phase. In step S401, a valid signal is applied to the input signal terminal IP, and an invalid signal is applied to the clock signal terminal CLK, the reset signal terminal RST and the pull-up holding signal terminal HP, so that a voltage at the pull-up point PU is valid to control the pull-up unit 2 to couple the clock signal terminal CLK to the output signal terminal OP, and the output signal terminal OP to output an invalid signal.

As shown in FIG. 5, the voltage at the input signal terminal IP is high, and the voltages at the clock signal terminal CLK, the reset signal terminal RST and the pull-up holding signal terminal HP are low. As shown in FIG. 3, the voltage at the pull-up holding signal terminal HP is low, so that the first transistor T1 is turned off. The voltage at the reset signal terminal RST is low, so that the fourth transistor T4 is turned off. The voltage at the input signal terminal IP is high, so that a voltage at the control electrode of the second transistor T2 is high and the second transistor T2 is turned on. The second transistor T2 is turned on to turn on a connection the first voltage terminal V1 and the pull-up point PU. The voltage at the pull-up point PU is changed to the voltage at the first voltage terminal V1, i.e., a high voltage. The high voltage at the pull-up point PU causes the third transistor T3 to be turned on to turn on a connection of the output signal terminal OP and the clock signal terminal CLK. The voltage at the output signal terminal OP is the same as the voltage at the clock signal terminal CLK, i.e., a low voltage. A voltage difference is generated across the first capacitor C1. The high voltage at the pull-up point PU also causes the seventh transistor T7 and the eighth transistor T8 to be turned on to turn on a connection of the second voltage terminal V2 and the control electrode of the sixth transistor T6 and turn on a connection between the second voltage terminal V2 and the pull-down point PD. At this time, a voltage at the control electrode of the fifth transistor T5 is the high voltage at the third voltage terminal V3, and the fifth transistor T5 is always turned on, so that a connection between the control electrode of the sixth transistor T6 and the third voltage terminal V3 is turned on. At this time, a voltage at the control electrode of the sixth transistor T6 may be maintained to be at a low voltage when both the fifth transistor T5 and the seventh transistor T7 are turned on at the same time by designing parameters (for example, aspect ratios) of the seventh transistor T7 and the fifth transistor T5. The voltage at the control electrode of the sixth transistor T6 is a low voltage, so that the sixth transistor T6 is turned off to turn off a connection between the third voltage terminal V3 and the pull-down point PD and maintain the low voltage at the pull-down point PD. The voltage at the pull-down point PD is a low voltage, so that the ninth transistor T9 and the tenth transistor T10 are turned off.

Then, the process proceeds to step S402, which is a pull-up phase. In step S402, a valid signal is applied to the clock signal terminal CLK and an invalid signal is applied to the input signal terminal IP, the reset signal terminal RST and the pull-up holding signal terminal HP, so that the voltage at the pull-up point PU is valid to control the pull-up unit 2 to couple the clock signal terminal CLK to the output signal terminal OP, and the output signal terminal OP to output a valid signal.

As shown in FIG. 5, the voltage at the clock signal terminal CLK is high, and the voltages at the input signal terminal IP, the reset signal terminal RST and the pull-up holding signal terminal HP are low. As shown in FIG. 3, the voltage at the pull-up holding signal terminal HP is low, so that the first transistor T1 is turned off. The voltage at the reset signal terminal RST is low, so that the fourth transistor T4 is turned off. The voltage at the input signal terminal IP is low, so that the second transistor T2 is turned off. The high voltage at the pull-up point PU causes the third transistor T3 to continue to be turned on to turn on a connection of the output signal terminal OP and the clock signal terminal CLK. The voltage at the output signal terminal OP is the same as the voltage at the clock signal terminal CLK, i.e., a high voltage. Also, a voltage difference between the pull-up point PU and the output signal terminal OP is maintained to be constant due to the bootstrap function of the capacitor, i.e., the voltage difference across the first capacitor C1 is maintained to be constant. Thus, after the voltage at the output signal terminal OP is raised, the voltage at the pull-up point PU is also raised by corresponding amplitude, so that the third transistor T3 is stably turned on. Further, the high voltage at the pull-up point PU still causes the seventh transistor T7 and the eighth transistor T8 to be turned on to turn on a connection of the second terminal voltage V2 and the control electrode of the sixth transistor T6 and turn on a connection between the second voltage terminal V2 and the pull-down point PD. The voltage at the control electrode of the sixth transistor T6 is a low voltage, so that the sixth transistor T6 is turned off to turn off a connection between the third voltage terminal V3 and the pull-down point PD and maintain the low voltage at the pull-down point PD. The voltage at the pull-down point PD is a low voltage, so that the ninth transistor T9 and the tenth transistor T10 are turned off.

Then, the process proceeds to step S403, which is a pull-up holding phase. In step S403, a valid signal is applied to the pull-up holding signal terminal HP, and an invalid signal is applied to the input signal terminal IP, the clock signal terminal CLK and the reset signal terminal RST, so that the voltage at the pull-up point PU is maintained to be valid to control the pull-up unit 2 to couple the clock signal terminal CLK to the output signal terminal OP, and the output signal terminal OP to output an invalid signal.

As shown in FIG. 5, the voltage at the pull-up holding signal terminal HP is high, and the voltages at the input signal terminal IP, the clock signal terminal CLK and the reset signal terminal RST are low. As shown in FIG. 3, the voltage at the input signal terminal IP is low, so that the second transistor T2 is turned off. The voltage at the reset signal terminal RST is low, so that the fourth transistor T4 is turned off. The voltage at the pull-up holding signal terminal HP is high, so that the first transistor T1 is turned on to turn on a connection the pull-up holding signal terminal HP and the pull-up point PU to cause the voltage at the pull-up point PU to be high. The high voltage at the pull-up point PU causes the third transistor T3 to continue to be turned on to turn on a connection the output signal terminal OP and the clock signal terminal CLK. The voltage at the output signal terminal OP is the same as the voltage at the clock signal terminal CLK, i.e., a low voltage. As the third transistor T3 is always maintained to be turned on, when the voltage of the clock signal at the clock signal terminal CLK is switched (for example, from a high voltage to a low voltage), the voltage of the output signal at the output signal terminal OP is switched therewith.

In this process, it needs not to use other transistors, a state of the third transistor T3 needs not be changed (i.e., the state of the third transistor T3 needs not to be changed from a turn-off state to a turn-on state), and the voltage of the output signal at the output signal terminal OP can be switched rapidly. Also, the third transistor T3 may be configured to increase a size to increase a current flow capacity, so that the time required for switching the voltage of the output signal at the output signal terminal OP can be further shortened.

Likewise, the high voltage at the pull-up point PU still causes the seventh transistor T7 and the eighth transistor T8 to be turned on to turn on a connection the second voltage terminal V2 and the control electrode of the sixth transistor T6, and turn on a connection between the second voltage terminal V2 and the pull-down point PD. The voltage at the control electrode of the sixth transistor T6 is a low voltage, so that the sixth transistor T6 is turned off to turn off a connection between the third voltage terminal V3 and the pull-down point PD, and maintain the low voltage at the pull-down point PD. The voltage at the pull-down point PD is a low voltage, so that the ninth transistor T9 and the tenth transistor T10 are turned off.

Then, the process proceeds to step S404, which is a reset phase. In step S404, a valid signal is applied to the reset signal terminal RST, and an invalid signal is applied to the input signal terminal IP, the clock signal terminal CLK and the pull-up holding signal terminal HP, so that the voltage at the pull-up point PU is invalid to control the pull-down unit 5 to couple the second voltage terminal V2 to the pull-up point PU and the output signal terminal OP, and the output signal terminal OP to output an invalid signal.

As shown in FIG. 5, the voltage at the reset signal terminal RST is high, and the voltages at the input signal terminal IP and the pull-up holding signal terminal HP are low. As shown in FIG. 3, the voltage at the pull-up holding signal terminal HP is low, so that the first transistor T1 is turned off. The voltage at the input signal terminal IP is low, so that the second transistor T2 is turned off. The voltage at the reset signal terminal RST is high, so that the fourth transistor T4 is turned on to turn on a connection the second voltage terminal V2 and the pull-up point PU, and the voltage at the pull-up point PU is the same as the voltage at the second voltage terminal V2, i.e., a low voltage. The low voltage at the pull-up point PU causes the third transistor T3 to be turned off to turn off a connection between the output signal terminal OP and the clock signal terminal CLK. It will be understood that in this phase, the voltage at the output signal terminal OP is independent of the voltage at the clock signal terminal CLK. The low voltage at the pull-up point PU causes the seventh transistor T7 and the eighth transistor T8 to be turned off to turn off a connection between the second voltage terminal V2 and the control electrode of the sixth transistor T6, and turn off a connection between the second voltage terminal V2 and the pull-down point PD. The voltage at the control electrode of the fifth transistor T5 is the high voltage at the third voltage terminal V3, and the fifth transistor T5 is always turned on, so that the voltage at the control electrode of the sixth transistor T6 is a high voltage. The sixth transistor T6 is turned on to turn on a connection the third voltage terminal V3 and the pull-down point PD, so that the voltage at the pull-down point PD is a high voltage. The high voltage at the pull-down point PD causes the ninth transistor T9 and the tenth transistor T10 to be turned on. The ninth transistor T9 turns on a connection between the second voltage terminal V2 and the pull-up point PU, and the tenth transistor T10 turns on a connection between the second voltage terminal V2 and the signal output terminal. The voltage at the signal output terminal is the same as the voltage at the second voltage terminal V2, i.e., a low voltage.

Then, the process proceeds to step S405, which is a pull-down holding phase. In step S405, an invalid signal is applied to the input signal terminal IP, the reset signal terminal RST and the pull-up holding signal terminal HP, so that the voltage at the pull-up point PU is invalid to control the pull-down unit 5 to couple the second voltage terminal V2 to the pull-up point PU and the output signal terminal OP, and the output signal terminal OP to output an invalid signal.

As shown in FIG. 5, the voltages at the input signal terminal IP, the reset signal terminal RST and the pull-up holding signal terminal HP are low. As shown in FIG. 3, the voltage at the pull-up holding signal terminal HP is low, so that the first transistor T1 is turned off. The voltage at the input signal terminal IP is low, so that the second transistor T2 is turned off. The voltage at the reset signal terminal RST is low, so that the fourth transistor T4 is turned off. The low voltage at the pull-up point PU causes the third transistor T3 to be turned off to turn off a connection between the output signal terminal OP and the clock signal terminal CLK. It will be understood that in this phase, the voltage at the output signal terminal OP is still independent of the voltage at the clock signal terminal CLK. When the voltages at the input signal terminal IP, the reset signal terminal RST and the pull-up holding signal terminal HP are maintained to be low, the voltage at the output signal terminal OP is maintained at a low voltage regardless of the voltage at the clock signal terminal CLK. The low voltage at the pull-up point PU causes the seventh transistor T7 and the eighth transistor T8 to be turned off to turn off a connection between the second voltage terminal V2 and the control electrode of the sixth transistor T6, and turn off a connection between the second voltage terminal V2 and the pull-down point PD. The voltage at the control electrode of the fifth transistor T5 is the high voltage at the third voltage terminal V3, and the fifth transistor T5 is always turned on, so that the voltage at the control electrode of the sixth transistor T6 is a high voltage. The sixth transistor T6 is turned on to turn on a connection the third voltage terminal V3 and the pull-down point PD, so that the voltage at the pull-down point PD is a high voltage. The high voltage at the pull-down point PD causes the ninth transistor T9 and the tenth transistor T10 to be turned on. The ninth transistor T9 turns on a connection between the second voltage terminal V2 and the pull-up point PU, and the tenth transistor T10 turns on a connection between the second voltage terminal V2 and the signal output terminal. The voltage at the signal output terminal is the same as the voltage at the second voltage terminal V2, i.e., a low voltage. The pull-down holding phase may last until a valid signal is applied to the input signal terminal IP again.

As described above, in the pull-up holding phase, the voltage at the pull-up point PU is caused to be valid to control the pull-up unit 2 to couple the clock signal terminal CLK to the output signal terminal OP, and when the voltage of the clock signal at the clock signal terminal CLK is switched (for example, from a high voltage to a low voltage), the voltage of the output signal at the output signal terminal OP is switched therewith. In this process, the voltage of the output signal at the output signal terminal OP can be switched quickly without waiting for a change in the state of the transistor.

Figure 6:
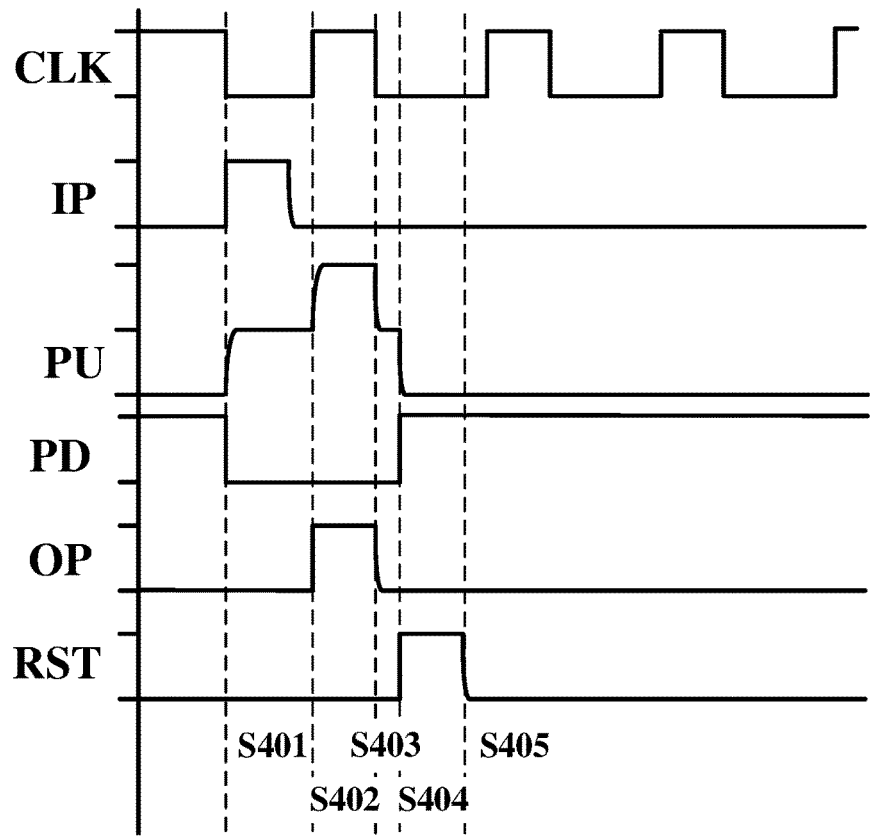
FIG. 6 is a second operation timing diagram corresponding to the driving method shown in FIG. 4.

FIG. 6 is a second operation timing diagram corresponding to the driving method shown in FIG. 4. As shown in FIG. 6, the driving method according to the embodiment of the present application may also be applied to a shift register which does not comprise the pull-up holding unit 6. As shown in FIG. 6, after step S403 is completed, no valid signal is applied to the pull-up point through the pull-up holding unit 6, and the valid voltage at the pull-up point is maintained only by causing the clock signal to be invalid and maintaining the reset signal to be invalid in step S404.

Figure 7:
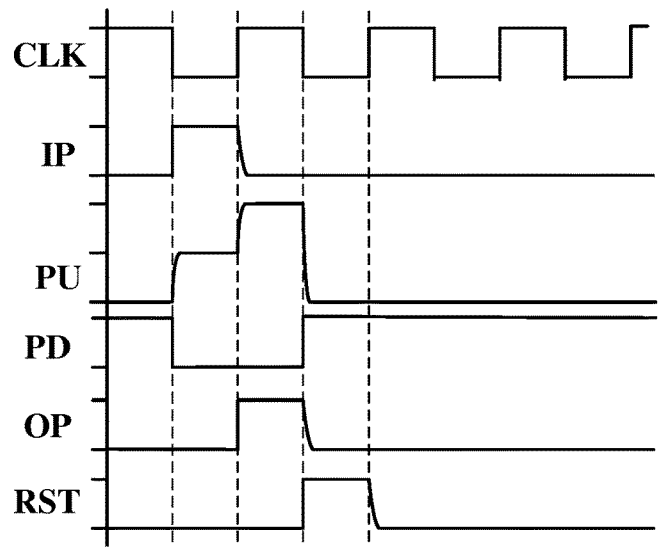
FIG. 7 is an operation timing diagram of a method for driving a shift register in the prior art.

FIG. 7 is an operation timing diagram of a method for driving a shift register in the prior art. As shown in FIG. 7, there is no pull-up holding phase in the process of driving a shift register in the prior art. In the pull-up phase, the voltage at the output signal terminal OP is high. After the pull-up phase, the process directly proceeds to the reset phase. In the reset phase, the voltage at the pull-up point PU is changed to a low voltage and the pull-up unit 2 is turned off; and the voltage at the pull-down point PD is changed to a high voltage and the pull-down unit 5 is turned on, so that the voltage at the output signal terminal OP is low.

As it takes some time for the pull-down unit 5 to be changed from turn-off to turn-on, the voltage at the output signal terminal OP can be changed to a low voltage only after the time elapses. In this way, it takes a long time for the pulse signal to be switched from a valid voltage to an invalid voltage, and the pulse signal does not have a steep enough edge, which may cause noises and may result in problems such as malfunction of the circuit etc.

Figure 8:
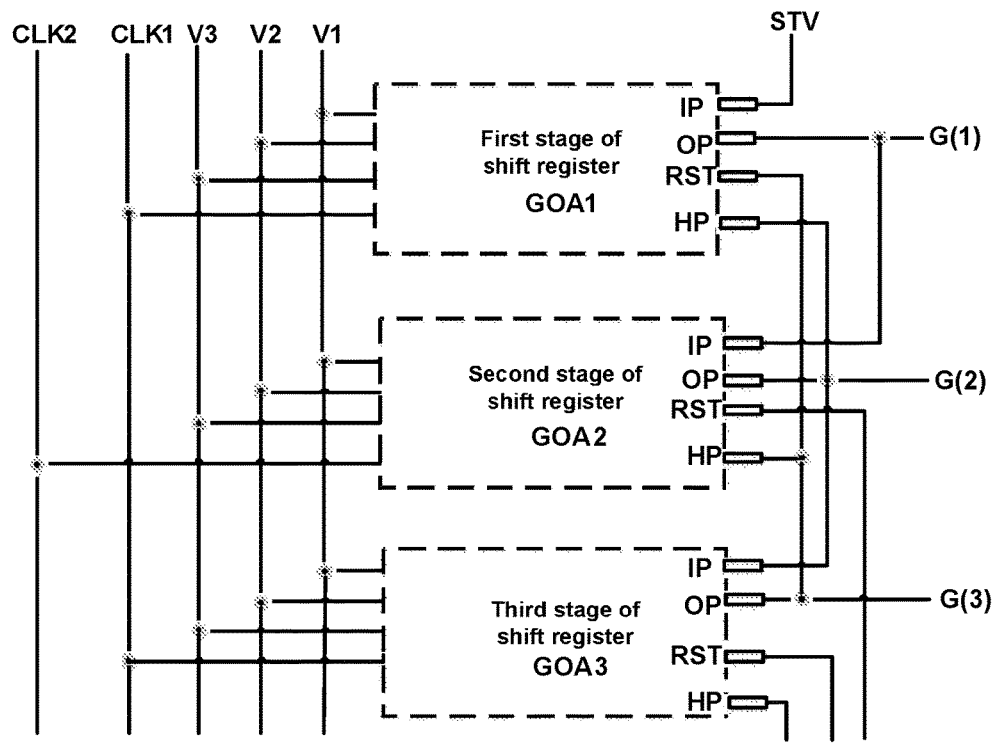
FIG. 8 is a block diagram of a gate driving circuit according to an embodiment of the present application.

FIG. 8 is a block diagram of a gate driving circuit according to an embodiment of the present application. As shown in FIG. 8, the gate driving circuit comprises a plurality of cascaded shift registers. FIG. 8 illustrates first three stages of shift registers, and subsequent repetition structures are omitted. In every three stages of shift registers, a first stage of shift register GOA1 has an output signal terminal OP coupled to an input signal terminal IP of a second stage of shift register GOA2, a pull-up holding signal terminal HP coupled to an output signal terminal OP of the second stage of shift register GOA2 and a reset signal terminal RST coupled to an output signal terminal OP of a third stage of shift register GOA3. A clock signal terminal CLK of the first stage of shift register GOA1 and a clock signal terminal CLK of the third stage of shift register GOA3 are coupled to a first clock signal source CLK1. A clock signal terminal CLK of the second stage of shift register GOA2 is coupled to a second clock signal source CLK2.

Figure 9:
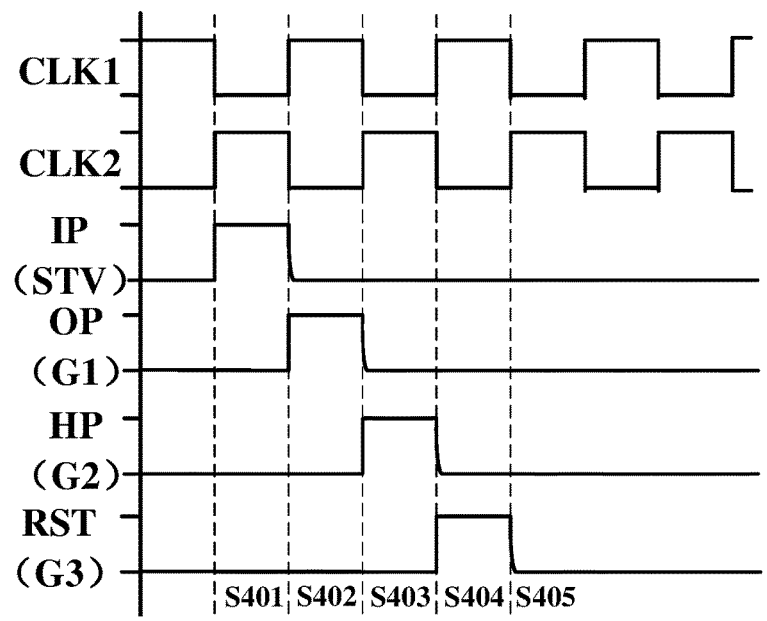
FIG. 9 is an operation timing diagram of the gate driving circuit shown in FIG. 8.

FIG. 9 is an operation timing diagram of the gate driving circuit shown in FIG. 8. An operation timing of each shift register in the gate driving circuit is exactly the same as that shown in FIG. 5, and an operation timing of signals associated with the first stage of shift register GOA1 is highlighted in FIG. 9. For the first stage of shift register GOA1, in step S401, a scan start signal STV is applied to the input signal terminal IP. In step S402, the output signal terminal OP outputs a valid signal G1, which is applied to the input signal terminal IP of the second stage of shift register GOA2. In step S403, an output signal G2 from the second stage of shift register GOA2 is applied to the pull-up holding signal terminal HP. In step S404, an output signal G3 from the second stage of shift register GOA2 is applied to the reset signal terminal RST.

It is to be understood that in order to satisfy timing requirements, the clock signal terminals CLK of the first stage of shift register GOA1 and the third stage of shift register GOA3 are connected to the first clock signal source CLK1 and the clock signal terminal CLK of the second stage of shift register GOA2 is connected to the second clock signal source CLK2. In the present embodiment, the first clock signal source CLK1 has the same clock signal waveform as that of the second clock signal source CLK2, but there is a phase difference of 180 degrees between the first clock signal source CLK1 and the second clock signal source CLK2.

The gate driving circuit according to the embodiments of the present application can sequentially output multiple stages of scanning signals, and falling edges of the scanning signals are steep, which can reduce noises in the circuit, thereby preventing malfunction of the circuit. In addition, the pull-up holding signal is an output from a next stage of shift register, and thus there is no need for an additional signal source, which can save resources of the circuit and reduce the cost.

It is to be understood that the above embodiments are merely illustrative embodiments for the purpose of illustrating the principles of the present application. However, the present application is not limited thereto. It will be apparent to those of ordinary skill in the art that various variations and improvements can be made therein without departing from the spirit and essence of the present application, and are also considered to be within the protection scope of the present application.

We claim:

1. A shift register, comprising:
an input unit coupled to an input signal terminal, a first voltage terminal and a pull-up point, and configured to couple the first voltage terminal to the pull-up point under a control of an input signal from the input signal terminal;
a pull-up unit coupled to the pull-up point, a clock signal terminal and an output signal terminal, and configured to couple the clock signal terminal to the output signal terminal under a control of a voltage at the pull-up point;
a reset unit coupled to a reset signal terminal, a second voltage terminal and the pull-up point, and configured to couple the second voltage terminal to the pull-up point under a control of a reset signal from the reset signal terminal;
a pull-down control unit coupled to the pull-up point, the second voltage terminal, a third voltage terminal and the pull-down point, and configured to selectively couple one of the second voltage terminal and the third voltage terminal to the pull-down point under a control of the voltage at the pull-up point;
a pull-down unit coupled to the pull-down point, the second voltage terminal, the pull-up point and the output signal terminal, and configured to couple the second voltage terminal to the pull-up point and the output signal terminal under a control of a voltage at the pull-down point; and
a pull-up holding unit coupled to a pull-up holding signal terminal, a fourth voltage terminal and the pull-up point, and configured to couple the fourth voltage terminal to the pull-up point under a control of a pull-up holding signal from the pull-up holding signal terminal, to maintain the voltage at the pull-up point to be valid,
wherein the pull-up unit comprises a third transistor, which has a control electrode coupled to the pull-up point, a first electrode coupled to the clock signal terminal and a second electrode coupled to the output signal terminal, and
wherein the valid voltage maintained at the pull-up point controls the third transistor to be turned on so as to couple the clock signal terminal to the output signal terminal when an invalid signal is being applied to the clock signal terminal, and controls the output signal terminal to output an invalid signal.

2. The shift register according to claim 1, wherein the pull-up holding unit is coupled to the pull-up holding signal terminal and the pull-up point, and is configured to couple the pull-up holding signal terminal to the pull-up point under a control of the pull-up holding signal from the pull-up holding signal terminal.

3. The shift register according to claim 1, wherein the pull-up holding unit comprises a first transistor having a control electrode coupled to the pull-up holding signal terminal, a first electrode coupled to the fourth voltage terminal and a second electrode coupled to the pull-up point.

4. The shift register according to claim 3, wherein the input unit comprises a second transistor having a control electrode coupled to the input signal terminal, a first electrode coupled to the first voltage terminal and a second electrode coupled to the pull-up point.

5. The shift register according to claim 1, wherein the pull-up unit further comprises a first capacitor, wherein the first capacitor has two terminals coupled between the control electrode and the second electrode of the third transistor.

6. The shift register according to claim 5, wherein the reset unit comprises a fourth transistor having a control electrode coupled to the reset signal terminal, a first electrode coupled to the second voltage terminal and a second electrode coupled to the pull-up point.

7. The shift register according to claim 6, wherein the pull-down control unit comprises a fifth transistor, a sixth transistor, a seventh transistor and an eighth transistor, wherein:
the fifth transistor has a control electrode and a first electrode coupled to the third voltage terminal and a second electrode coupled to a control terminal of the sixth transistor;
the sixth transistor has a first electrode coupled to the third voltage terminal and a second electrode coupled to the pull-down point;
the seventh transistor has a control electrode coupled to the pull-up point, a first electrode coupled to the second voltage terminal and a second electrode coupled to the control electrode of the sixth transistor; and
the eighth transistor has a control electrode coupled to the pull-up point, a first electrode coupled to the second voltage terminal and a second electrode coupled to the pull-down point.

8. The shift register according to claim 7, wherein the pull-down unit comprises a ninth transistor and a tenth transistor, wherein:
the ninth transistor has a control electrode coupled to the pull-down point, a first electrode coupled to the second voltage terminal and a second electrode coupled to the pull-up point; and
the tenth transistor has a control electrode coupled to the pull-down point, a first electrode coupled to the second voltage terminal and a second electrode coupled to the output signal terminal.

9. A method for driving the shift register according to claim 1, the method comprising:
applying a valid signal to the input signal terminal, and applying an invalid signal to the clock signal terminal and the reset signal terminal, so that a voltage at the pull-up point is valid to control the pull-up unit to couple the clock signal terminal to the output signal terminal and the output signal terminal to output an invalid signal;
applying a valid signal to the clock signal terminal, and applying an invalid signal to the input signal terminal and the reset signal terminal, so that the voltage at the pull-up point is valid to control the pull-up unit to couple the clock signal terminal to the output signal terminal and the output signal terminal to output a valid signal;
applying an invalid signal to the input signal terminal, the clock signal terminal and the reset signal terminal, and maintaining the voltage at the pull-up point to be valid, to control the pull-up unit to couple the clock signal terminal to the output signal terminal and the output signal terminal to output an invalid signal;
applying a valid signal to the reset signal terminal and applying an invalid signal to the input signal terminal, so that the voltage at the pull-up point is invalid to control the pull-down unit to couple the second voltage terminal to the pull-up point and the output signal terminal, and the output signal terminal to output an invalid signal; and
applying an invalid signal to the input signal terminal and the reset signal terminal, so that the voltage at the pull-up point is invalid to control the pull-down unit to couple the second voltage terminal to the pull-up point and the output signal terminal, and the output signal to output an invalid signal.

10. The method according to claim 9, wherein maintaining the voltage at the pull-up point to be valid comprises: applying a valid signal to the pull-up holding signal terminal to control the pull-up holding unit to couple the fourth voltage terminal to the pull-up point.

11. A gate driving circuit comprising a plurality of cascaded shift registers according to claim 1, wherein:
in every three stages of shift registers,
a first stage of shift register has an output signal terminal coupled to an input signal terminal of a second stage of shift register, a pull-up holding signal terminal coupled to an output signal terminal of the second stage of shift register and a reset signal terminal coupled to an output signal terminal of a third stage of shift register;
a clock signal terminal of the first stage of shift register and a clock signal terminal of the third stage of shift register are coupled to a first clock signal source; and
a clock signal terminal of the second stage of shift register is coupled to a second clock signal source.

12. A display apparatus comprising the gate driving circuit according to claim 11.

* * * * *